(12) United States Patent
Randall et al.

(10) Patent No.: US 7,545,623 B2
(45) Date of Patent: Jun. 9, 2009

(54) INTERPOSER DECOUPLING ARRAY HAVING REDUCED ELECTRICAL SHORTS

(75) Inventors: Michael S. Randall, Simpsonville, SC (US); Garry Renner, Easley, SC (US)

(73) Assignee: Kemet Electronics Corporation, Greenville, SC (US)

( * ) Notice: Subject to any disclaimer, the term of this patent is extended or adjusted under 35 U.S.C. 154(b) by 235 days.

(21) Appl. No.: 11/604,409

(22) Filed: Nov. 27, 2006

(65) Prior Publication Data
US 2008/0123247 A1    May 29, 2008

(51) Int. Cl.
*H01G 4/228* (2006.01)
(52) U.S. Cl. ............ 361/306.2; 361/306.1; 361/306.3; 361/321.1; 361/308.1; 361/309
(58) Field of Classification Search ............ 361/306.1, 361/306.2, 306.3, 311–313, 303, 321.1, 321.2, 361/308.1, 309
See application file for complete search history.

(56) References Cited

U.S. PATENT DOCUMENTS

| | | | |
|---|---|---|---|
| 6,292,351 B1 * | 9/2001 | Ahiko et al. | 361/306.3 |
| 6,452,781 B1 * | 9/2002 | Ahiko et al. | 361/321.2 |
| 6,545,346 B2 * | 4/2003 | Figueroa et al. | 257/678 |
| 6,618,266 B2 | 9/2003 | Blakely et al. | 361/763 |
| 6,795,294 B2 * | 9/2004 | Kuroda et al. | 361/306.1 |
| 6,956,730 B2 * | 10/2005 | Togashi | 361/309 |
| 7,057,878 B2 | 6/2006 | Vierow et al. | 261/328 |
| 7,068,490 B2 | 6/2006 | Prymak | 361/306.3 |

* cited by examiner

*Primary Examiner*—Nguyen T Ha
(74) *Attorney, Agent, or Firm*—Joseph T. Guy; Nexsen Pruet, LLC

(57) ABSTRACT

A capacitor array with a multiplicity of capacitors with terminations of alternating polarity wherein the terminations are arranged in M columns and N rows. A circuit is provided with terminations in a grid of L columns and K rows wherein the terminations are of alternating polarity with the proviso that a first terminal with $L=\alpha M$ has the same polarity as a second terminal with $L=\alpha M+1$ wherein $\alpha$ is an integer.

34 Claims, 4 Drawing Sheets

US 7,545,623 B2

INTERPOSER DECOUPLING ARRAY HAVING REDUCED ELECTRICAL SHORTS

FIELD OF THE INVENTION

The present invention is related to a decoupling array having reduced electrical shorts due to the relative orientation of two-pole electrical components or devices, such as capacitors, on a circuit board or substrate. More specifically, the present invention is related to an electrical component comprising a multiplicity of two-pole electrical components or devices, such as capacitors, on a substrate wherein the substrate and two-pole electrical components or devices are integrally designed.

BACKGROUND OF THE INVENTION

Capacitors, particularly interdigitated capacitors, and other two-pole electrical components or devices, are well known in the art of electrical components as exemplified in U.S. Pat. No. 4,831,494 to Arnold et al. Capacitors typically comprise parallel plates, which act as charge collectors and sources, with a dielectric there between. The function of capacitors is well known and further discussion is not warranted herein.

The capacitors are elements that are added to circuitry with primarily a singular function. The primary function being a source of energy for the circuit to function. In this application, it is counted on to provide a reserve of energy mounted on to circuit traces or to electronically filter noise from the input or power signal, and in itself does not contribute to the circuit charge or discharge path. In many cases, traces have to be extended from the direct path of the power delivery to connect to the capacitor.

Capacitors are applied in an array when there is a necessity for large quantities of power in short durations. The energy is stored in the array of capacitors until a near instantaneous release of energy is required at which point the array of capacitors, or portions of the array, are discharged to provide a power source to serve a useful function.

As with any electrical device there is an ever pressing and ongoing desire for miniaturization. Decoupling arrays are not immune to this desire and, in fact, are a major focus in the desire to decrease the size of components and equipment containing the components. The efforts directed at miniaturization are countered by the equally pressing desires to simplify circuit complexity and efforts to minimize manufacturing complexities. The more complicated the circuit traces become the more susceptible the finished product is to product defects. Similarly, with more complex manufacturing processes the losses due to errors increases as does the cost associated with inferior products or products requiring rework.

There has been no shortage of effort focused on component miniaturization as exemplified in commonly assigned U.S. Pat. No. 7,068,490 to Prymak. In spite of the intense effort to miniaturize arrays the effort has been thwarted by the spacing required between capacitors. FIGS. 1 and 2, for example, illustrate the typical substrate utilized for capacitors, or decoupling, arrays or other two-pole electrical components such as varistors. In each figure the pattern is interdigitated wherein the power and ground terminations, 901 and 902 respectively, are adjacent as in a checkerboard pattern. If a capacitor, as shown in FIG. 3, is mounted on the substrate the terminal power tab, 404, of one capacitor will be adjacent to the ground tab, 406, of the adjacent capacitor. Therefore, the spacing of adjacent capacitors must be sufficiently large to avoid electrical shorting between the power tab of one capacitor and the ground tab of the adjacent capacitor.

The conflicting desires to miniaturize electrical components, while still maintaining simple circuit traces and reasonable manufacturing capabilities, has lead to the current conundrum wherein large steps in further miniaturization are no longer possible. The present invention provides a unique approach through integrated design of the capacitor and circuit board such that a significant reduction in size can be achieved without electrical shorting and without the necessity of difficult designs and manufacturing processes.

SUMMARY OF THE INVENTION

It is an object of the invention to provide a decoupling array which can be miniaturized without increasing the number of electrical shorts between adjacent two-pole devices.

It is another object of the invention to provide a decoupling array which can be assembled using conventional manufacturing equipment without regard for the polarity.

A particular feature of the present invention is the ability to utilize circuit boards which are simple and which do not have complex configurations or designs.

These and other advantages, as will be realized, are provided in a capacitor array with a multiplicity of capacitors with terminations of alternating polarity wherein the terminations are arranged in M columns and N rows. A circuit is provided with terminations in a grid of L columns and K rows wherein the terminations are of alternating polarity with the proviso that a first terminal with $L=\alpha M$ has the same polarity as a second terminal with $L=\alpha M+1$ wherein $\alpha$ is an integer.

Yet another embodiment is provided in a capacitor array with a multiplicity of capacitors with terminations of alternating polarity wherein the terminations are arranged in M columns and N rows. A circuit is provided with terminations in a grid of L columns and K rows wherein the terminations are of alternating polarity with the proviso that a first terminal with $L=\alpha M$ has the same polarity as a second terminal with $L=\alpha M+1$ wherein $\alpha$ is an integer and a third terminal with $K=\beta N$ has the same polarity as a fourth terminal with $K=\beta N+1$ wherein $\beta$ is an integer.

Yet another embodiment is provided in an electrical array. The array has a device with terminations of alternating polarity wherein the terminations are arranged in M columns and N rows. A circuit with the device mounted thereto comprises terminations in a grid of L columns and K rows wherein the terminations are of alternating polarity with the proviso that a first terminal with $L=\alpha M$ has the same polarity as a second terminal with $L=\alpha M+1$ and wherein $\alpha$ is an integer.

Yet another embodiment is provided in an electrical component array. The array has a multiplicity of devices with terminations of alternating polarity wherein the terminations are arranged in M columns and N rows. A circuit with the multiplicity of devices mounted thereto has terminations in a grid of L columns and K rows wherein the terminations are of alternating polarity with the proviso that a first terminal with $L=\alpha M$ has the same polarity as a second terminal with $L=\alpha M+1$ wherein $\alpha$ is an integer and a third terminal with $K=\beta N$ has the same polarity as a fourth terminal with $K=\beta N+1$ wherein $\beta$ is an integer.

DETAILED DESCRIPTION OF THE DRAWINGS AND INVENTION

The invention will be described with reference to the drawings forming an integral part of the disclosure.

Figure 1:
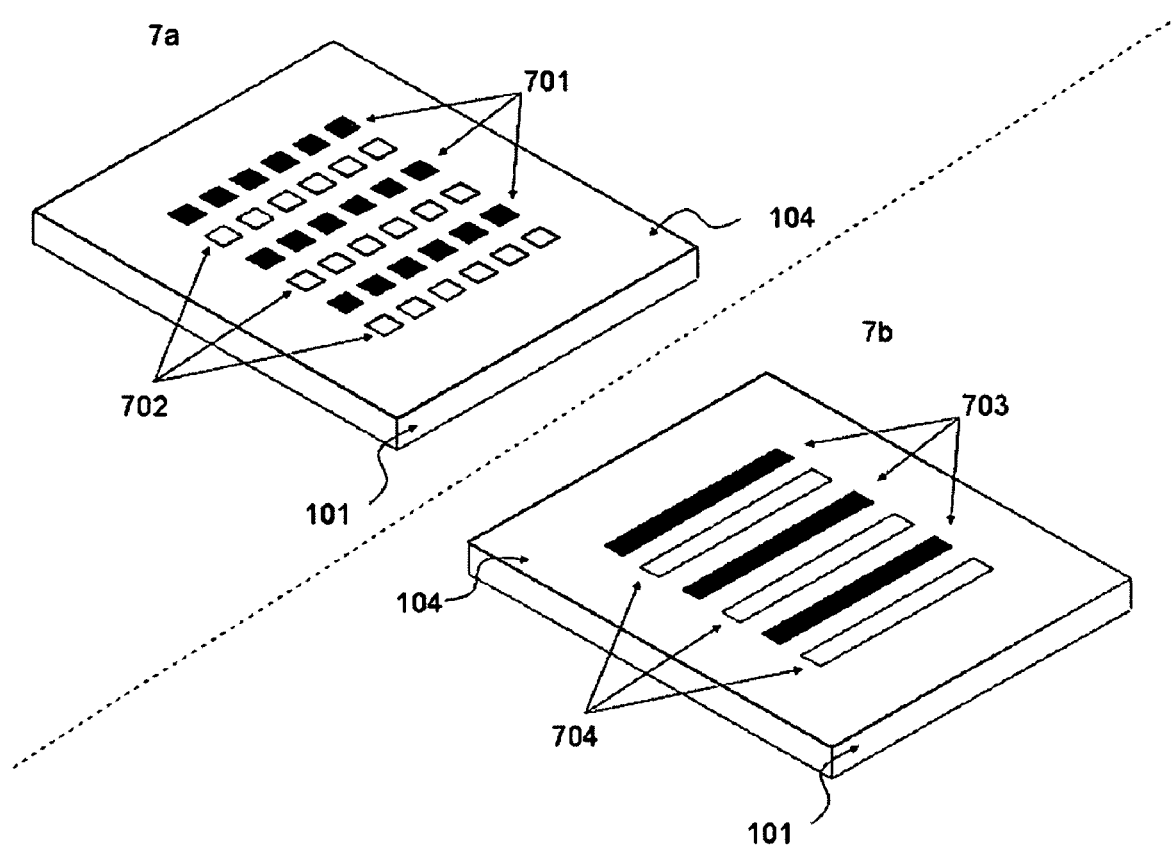
FIG. 1 illustrates a prior art grid array for mounting capacitors thereon.
Figure 2:
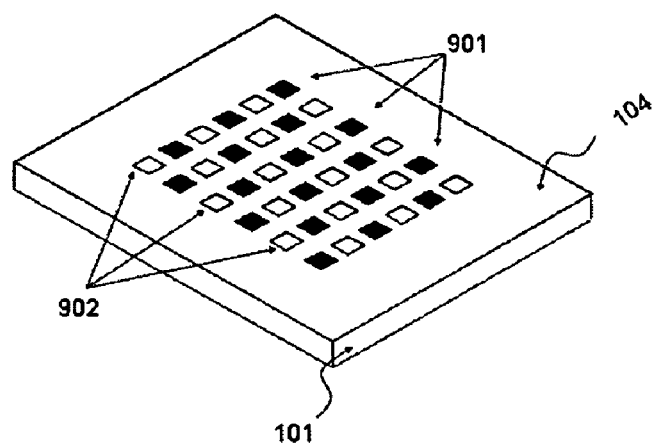
FIG. 2 illustrates another prior art grid array for mounting capacitors thereon.
Figure 3:
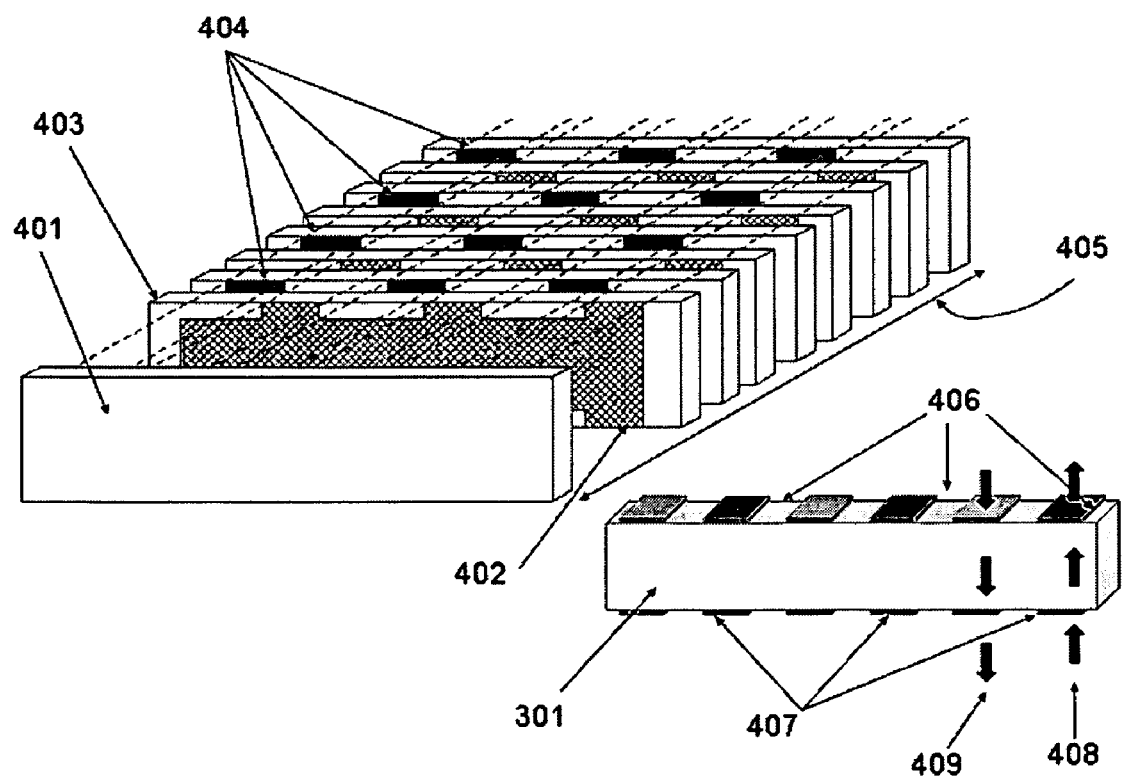
FIG. 3 illustrates a face mount capacitor in exploded and perspective views.

The configuration of face-mount multilayer capacitors is well known in the art and fully described in U.S. Pat. No. 7,068,490. A representative capacitor is illustrated schematically in FIG. 3. Individual dielectric layers or material, 401, are stacked in a multilayer fashion with the electrode patterns, 402, creating the capacitive layers and edge connectors at least at the top and optionally on the bottom of the device. The electrode pattern, 402, is created to allow the multiple edge connectors on the same plate to terminate to non-adjacent termination pads, 406 or 407, with adjacent termination pads connecting to adjacent electrode layers. The electrode pattern may comprise rectangular lead out tabs or the lead out tabs may be serpentine to control the ESR. A capacitor with as large a lead out tab as possible is desired to form a low ESR capacitor whereas a serpentine, or tortuous path, is desired for higher ESR. In the present application the term lead-out tab refers to both regular shaped lead out tabs and irregular shaped lead out tabs with irregular lead out tabs preferably designed to increase ESR. The stacking arrangement is completed to as maximum a depth, 405, as possible. The stacked layers are then pressed (and fired if ceramic) into a singular element, 301. If desired the singular element can be combined with additional singular elements. Termination pads at least at the top and optionally at the bottom faces of the element are formed as known in the art. The termination pads are created as metallic contacts that allow connection to the circuit as well as connecting the non-adjacent electrodes of the stack, 404, into a common or parallel arrangement.

The subunits are typically about 0.25 to 2 mm wide and 0.25 to 4 mm thick (excluding termination pads) and 1 to 8 mm long. Typically about 4 to 200 or more subunits are combined into a capacitor with about 100 being preferred. The termination pads are separated by a sufficient distance to avoid electrical arcing between pads. A separation of at least about 0.25 mm is preferred with about 1 mm being more preferred. The separation is typically defined by the pad separation dimensions of either the top circuit board or the bottom circuit board or both.

Figure 4A:
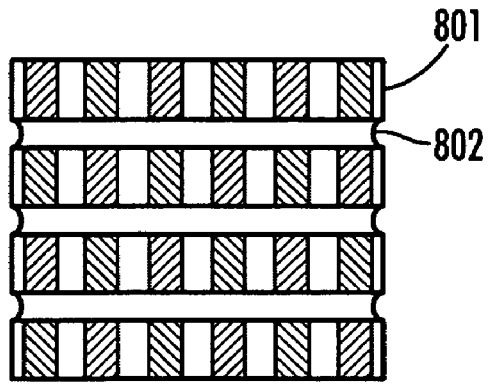
FIG. 4 illustrates a capacitor in top, side, cross-sectional and exploded views.
Figure 4B:
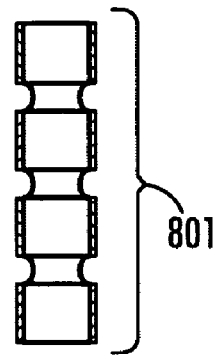
Figure 4C:
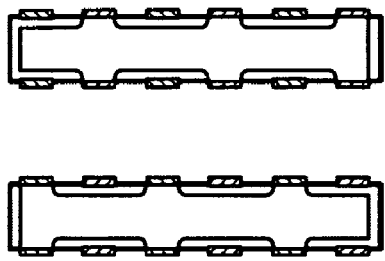
Figure 4D:
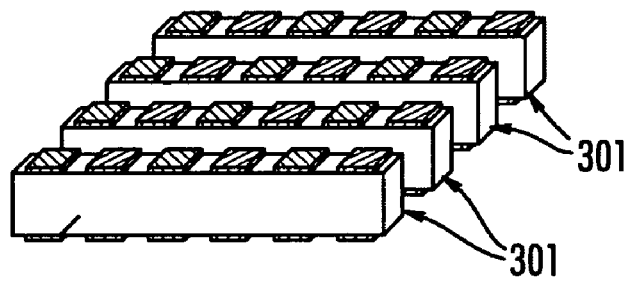
Figure 4E:
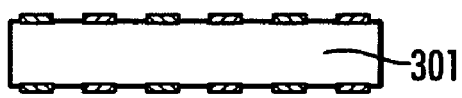

In FIG. 4(a), the assembly, 801, of individual elements, 301, has a bonding agent, 802, between the elements to allow a separation or isolation of the termination pads from one element to the other. This arrangement would allow for a fully interdigitated matrix of "power" and "ground" termination pads for the assembly, 801. The capacitor of FIG. 4(a) is shown in side view in FIG. 4(b) and in exploded view in FIG. 4d.

Figure 5:
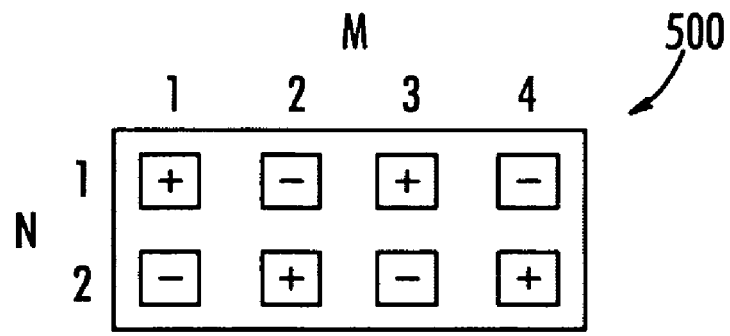
FIG. 5 illustrates a capacitor and the terminations in schematic view.

The present invention details a capacitor and circuit trace design which is integrated. The two-pole device, represented schematically as 500 in FIG. 5, comprises a row of terminations with alternating polarity designated as M with M indicating the number of terminations across a row. In the example there are four terminations for illustration purposes however the number of terminations in a row is a design choice. M is an integer and is preferably an even integer. The number of rows is designated by N. In the example there are two rows for illustration purposes however the number of rows is a design choice. N is an integer and is preferably an even integer. It would be apparent to one of skill in the art that the designations of positive and negative termination are arbitrarily chosen and could be reversed without consequence.

Figure 6:
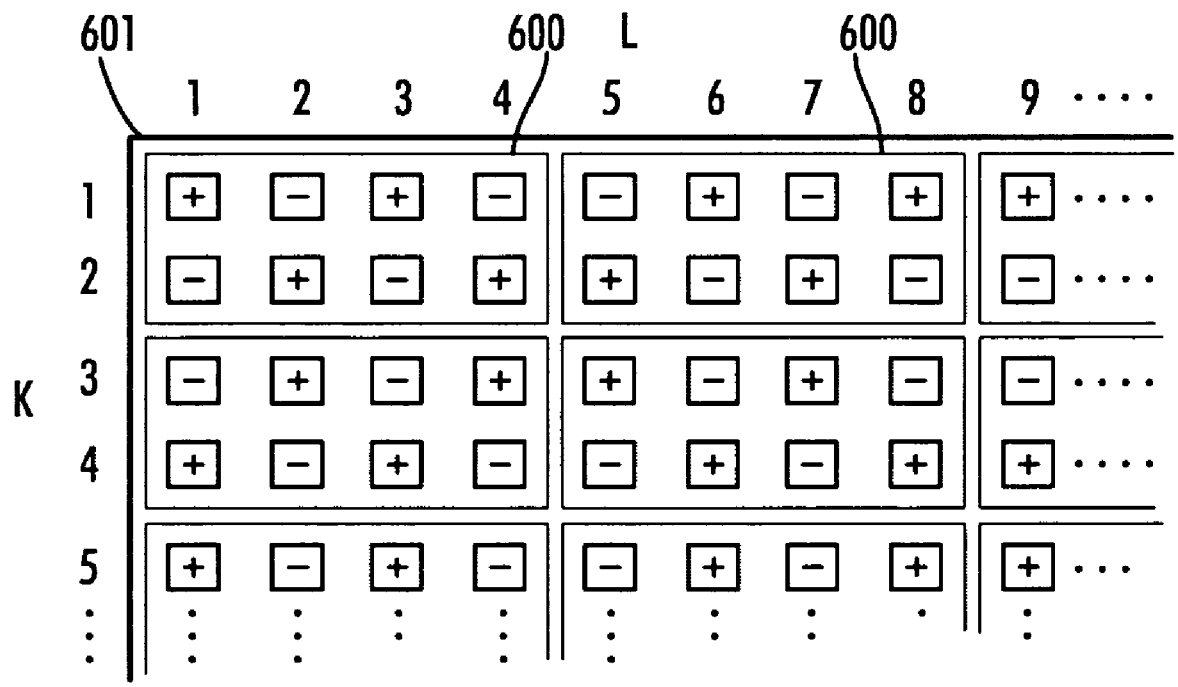
FIG. 6 illustrates an embodiment of the present invention.

The circuit trace design is illustrated in FIG. 6. In FIG. 6 the circuit trace 601 comprises an array of distinct terminations in alternating polarity. The number of terminations in a row is designated as L with L being the number of terminations in a row starting from a grid corner. The number of rows is designated as K with K being the number of rows starting from the same grid corner. Both L and K are integers. It is preferred that K/N is an integer and that L/M is an integer since this will allow for a complete packing of capacitors. The polarization of the terminations in a row on the circuit trace are alternating except that every termination with L=αM has the same polarity as the termination with L=αM+1 wherein α is an integer preferably from 1 to 1000. As will be realized α corresponds to the number of capacitors along side L. Likewise, the polarization of the terminations in each column alternates except that every termination with K=βN has the same polarity as the termination with K=βN wherein β is an integer preferably from 1 to 1000. As will be realized β corresponds to the number of capacitors along K. By way of example, the two-pole device, 600, of the example has four terminations in row M and two rows of terminations, N. Therefore, the polarity along the first row will be alternating except when L=αM and when L=αM+1 at which point the terminations are the same. With M being four and α being an integer the terminations will have the same polarity when L is 4 and 5, 8 and 9, 12 and 13, etc. Similarly, the polarity traversing down the row will have the same polarity when K is 2 and 3, 4 and 5, etc. It is preferred that in every instance the terminations of the two-pole device, 600, are adjacent to terminations with the same polarity. One of skill in the art could extend the teachings herein to an integrated device and circuit board design using a device with varying sizes and with any number of rows of columns of alternating polarity face terminations. It is most preferred that the two-pole devices all have the same dimensions and number of terminations, however, this is not a requirement. It would be apparent that certain combinations of sizes would not be compatible with the instant invention.

A particular advantage of the present invention is that the placement of two-pole devices can be accomplished without regard for orientation except that related to alignment. For example, referring to FIG. 6 if the device spanning L from 1 to 4 and K from 1 to 2 is rotated 180 degrees the electrical connectivity is identical. This greatly simplifies automated pick and place processes since no determination of polarity has to be made only length versus width. The present invention also eliminates the problems associated with shared terminations.

The invention is suitable for any two-pole electronic component. Capacitors and varistors are preferred with capacitors being most preferred.

Capacitors comprise alternating layers of conductor and dielectric wherein adjacent layers of conductor are of opposite polarity.

The dielectric layers may have any desired mean grain size, however, a mean grain size of about 0.2 to about 0.7 μm is preferred.

The dielectric layers have an appropriate Curie temperature which is determined in accordance with the applicable standards by suitably selecting a particular composition of dielectric material. Typically the Curie temperature is higher than 45° C., especially about 65° C. to 125° C.

Each dielectric layer preferably has a thickness of up to about 50 μm, more preferably up to about 20 μm. The lower limit of thickness is about 0.5 μm, preferably about 2 μm. The present invention is effectively applicable to multilayer ceramic chip capacitors having such thin dielectric layers for minimizing a change of their capacitance with time. The number of dielectric layers stacked is generally from 2 to about 300, preferably from 2 to about 200.

The conductor which forms the internal electrode layers is not critical, although a base metal preferably is used since the dielectric material of the dielectric layers has anti-reducing properties. Typical base metals are nickel and nickel alloys. Preferred nickel alloys are alloys of nickel with at least one member selected from Mn, Cr, Co, and Al, with such nickel alloys containing at least 95 wt % of nickel being more preferred. It is to be noted that nickel and nickel alloys may contain up to about 0.1 wt % of phosphorous and other trace components.

The internal electrode layer may comprise conductive polymers without detriment to the instant invention. In fact, the structure of the capacitor, or other two-pole electronic component, is not limiting herein.

The thickness of the internal electrode layers may be suitably determined in accordance with a particular purpose and application although its upper limit is typically about 5 μm, preferably about 2.5 μm, and its lower limit is typically about 0.5 μm, preferably about 1 μm.

The conductor which forms the external electrodes is not critical, although inexpensive metals such as nickel, copper, and alloys thereof are preferred. The thickness of the external electrodes may be suitably determined in accordance with a particular purpose and application although it generally ranges from about 10 μm to about 50 μm.

The multilayer ceramic chip capacitor of the present invention generally is fabricated by forming a green chip by conventional printing and sheeting methods using pastes, firing the chip, and printing or transferring external electrodes thereto followed by baking.

Paste for forming the dielectric layers can be obtained by mixing a raw dielectric material with an organic vehicle. The raw dielectric material may be a mixture of oxides and composite oxides as previously mentioned. Also useful are various compounds which convert to such oxides and composite oxides upon firing. These include, for example, carbonates, oxalates, nitrates, hydroxides, and organometallic compounds. The dielectric material is obtained by selecting appropriate species from these oxides and compounds and mixing them. The proportion of such compounds in the raw dielectric material is determined such that after firing, the specific dielectric layer composition may be met. The raw dielectric material is generally used in powder form having a mean particle size of about 0.1 to about 3 μm, preferably about 1 μm.

The organic vehicle is a binder in an organic solvent. The binder used herein is not critical and may be suitably selected from conventional binders such as ethyl cellulose. Also the organic solvent used herein is not critical and may be suitably selected from conventional organic solvents such as terpineol, butylcarbinol, acetone, and toluene in accordance with a particular application method such as a printing or sheeting method.

Paste for forming internal electrode layers is obtained by mixing an electro-conductive material with an organic vehicle. The conductive material used herein includes conductors such as conductive metals and alloys as mentioned above and various compounds which convert into such conductors upon firing, for example, oxides, organometallic compounds and resinates. The organic vehicle is as mentioned above.

Paste for forming external electrodes is prepared by the same method as the internal electrodes layer-forming paste.

No particular limit is imposed on the organic vehicle content of the respective pastes mentioned above. Often the paste contains about 1 to 5 wt % of the binder and about 10 to 50 wt % of the organic solvent. If desired, the respective pastes may contain any other additives such as dispersants, plasticizers, dielectric compounds, and insulating compounds. The total content of these additives is preferably up to about 10 wt %.

A green chip then may be prepared from the dielectric layer-forming paste and the internal electrode layer-forming paste. In the case of printing method, a green chip is prepared by alternately printing the pastes onto a substrate of polyethylene terephthalate (PET), for example, in laminar form, cutting the laminar stack to a predetermined shape and separating it from the substrate.

Also useful is a sheeting method wherein a green chip is prepared by forming green sheets from the dielectric layer-forming paste, printing the internal electrode layer-forming paste on the respective green sheets, and stacking the printed green sheets.

The binder is then removed from the green chip and fired. Binder removal may be carried out under conventional conditions, preferably under the following conditions where the internal electrode layers are formed of a base metal conductor such as nickel and nickel alloys.

Heating rate: 5 to 300° C./hour, more preferably 10 to 100° C./hour. Holding temperature: 200 to 400° C., more preferably 250 to 300° C. Holding time: ½ to 24 hours, more preferably 5 to 20 hours, Atmosphere: air. The green chip is then fired in an atmosphere which may be determined in accordance with the type of conductor in the internal electrode layer-forming paste. Where the internal electrode layers are formed of a base metal conductor such as nickel and nickel alloys, the firing atmosphere may have an oxygen partial pressure of $10^{-8}$ to $10^{-12}$ atm. Extremely low oxygen partial pressure should be avoided, since at such low pressures the conductor can be abnormally sintered and may become disconnected from the dielectric layers. At oxygen partial pressures above the range, the internal electrode layers are likely to be oxidized.

For firing, the chip preferably is held at a temperature of 1,100° C. to 1,400° C., more preferably 1,250 to 1,400° C. Lower holding temperatures below the range would provide insufficient densification whereas higher holding temperatures above the range can lead to poor DC bias performance. Remaining conditions for sintering preferably are as follows. Heating rate: 50 to 500° C./hour, more preferably 200 to 300° C./hour. Holding time: ½ to 8 hours, more preferably 1 to 3 hours. Cooling rate: 50 to 500° C./hour, more preferably 200 to 300° C./hour. The firing atmosphere preferably is a reducing atmosphere. An exemplary atmospheric gas is a humidified mixture of $N_2$ and $H_2$ gases.

Firing of the capacitor chip in a reducing atmosphere preferably is followed by annealing. Annealing is effective for re-oxidizing the dielectric layers, thereby optimizing the resistance of the ceramic to dielectric breakdown. The annealing atmosphere may have an oxygen partial pressure of at least $10^{-6}$ atm., preferably $10^{-5}$ to $10^{-4}$ atm. The dielectric layers are not sufficiently re-oxidized at a low oxygen partial pressures below the range, whereas the internal electrode layers are likely to be oxidized at oxygen partial pressures above this range.

For annealing, the chip preferably is held at a temperature of lower than 1,100° C., more preferably 500° C. to 1,000° C. Lower holding temperatures below the range would oxidize the dielectric layers to a lesser extent, thereby leading to a shorter life. Higher holding temperatures above the range can cause the internal electrode layers to be oxidized (leading to a reduced capacitance) and to react with the dielectric material (leading to a shorter life). Annealing can be accomplished simply by heating and cooling. In this case, the holding temperature is equal to the highest temperature on heating and the holding time is zero. Remaining conditions for annealing preferably are as follows.

Holding time: 0 to 20 hours, more preferably 6 to 10 hours.
Cooling rate: 50 to 500° C./hour, more preferably 100 to 300° C./hour The preferred atmospheric gas for annealing is humid nitrogen gas. The nitrogen gas or a gas mixture used in binder removal, firing, and annealing, may be humidified using a wetter. In this regard, water temperature preferably is about 5 to 75° C.

The binder removal, firing, and annealing may be carried out either continuously or separately. If done continuously, the process includes the steps of binder removal, changing only the atmosphere without cooling, raising the temperature to the firing temperature, holding the chip at that temperature for firing, lowering the temperature to the annealing temperature, changing the atmosphere at that temperature, and annealing.

If done separately, after binder removal and cooling down, the temperature of the chip is raised to the binder-removing temperature in dry or humid nitrogen gas. The atmosphere then is changed to a reducing one, and the temperature is further raised for firing. Thereafter, the temperature is lowered to the annealing temperature and the atmosphere is again changed to dry or humid nitrogen gas, and cooling is continued. Alternately, once cooled down, the temperature may be raised to the annealing temperature in a nitrogen gas atmosphere. The entire annealing step may be done in a humid nitrogen gas atmosphere.

The resulting chip may be polished at end faces by barrel tumbling and sand blasting, for example, before the external electrode-forming paste is printed or transferred and baked to form external electrodes. Firing of the external electrode-forming paste may be carried out under the following conditions: a humid mixture of nitrogen and hydrogen gases, about 600 to 800° C., and about 10 minutes to about 1 hour.

Pads are preferably formed on the external electrodes by plating or other methods known in the art.

The multilayer ceramic chip capacitors of the invention can be mounted on printed circuit boards, for example, by soldering.

The present invention is particularly useful for use in electrical components which require a high energy over a short duration. The invention is also useful for other two-pole electronic devices such as varistors. Such applications include, but are not limited to, medical equipment and devices, weapons systems, computer and peripheral equipment, automotive applications, motor applications and the like.

The present invention has been described with particular reference to the preferred embodiments. It would be apparent from the description herein that other embodiments could be realized without departing from the scope of the invention which is set forth in the claims appended hereto.

The invention claimed is:

1. An electrical array comprising:
   multiple devices with each device comprising terminations of alternating polarity wherein said terminations are arranged in M columns and N rows on each said device;
   a circuit with said devices mounted thereto comprising pads in a grid of L columns and K rows wherein said pads are of alternating polarity with the proviso that a first pad with $L=\alpha M$ has the same polarity as a second pad with $L=\alpha M+1$ wherein $\alpha$ is an integer.

2. The electrical array of claim 1 wherein
   a third pad with $K=\beta N$ has the same polarity as a fourth pad with $K=\beta N+1$ wherein $\beta$ is an integer.

3. The electrical array of claim 2 wherein said $\beta$ is an integer from 1 to 1000.

4. The electrical array of claim 1 wherein said $\alpha$ is an integer from 1 to 1000.

5. The electrical array of claim 1 wherein at least one of said M and said N is an even integer.

6. The electrical array of claim 1 wherein at least one of K/N and L/M is an integer.

7. The electrical array of claim 1 wherein said device is selected from a capacitor and a varistor.

8. The electrical array of claim 7 wherein
   at least one device of said devices is a capacitor.

9. The electrical array of claim 8 wherein each said capacitor comprises an electrode with lead out tabs.

10. An electrical component comprising an electrical array of claim 1.

11. An electrical component array comprising:
    a multiplicity of devices with terminations of alternating polarity wherein said terminations are arranged in M columns and N rows;
    a circuit with said multiplicity of devices mounted thereto comprising pads in a grid of L columns and K rows wherein said pads are of alternating polarity with the proviso that a first pad with $L=\alpha M$ has the same polarity as a second pad with $L=\alpha M+1$ wherein $\alpha$ is an integer and a third pad with $K=\beta N$ has the same polarity as a fourth pad with $K=\beta N+1$ wherein $\beta$ is an integer.

12. The electrical component array of claim 11 wherein said $\beta$ is an integer from 1 to 1000.

13. The electrical component array of claim 11 wherein said $\alpha$ is an integer from 1 to 1000.

14. The electrical component array of claim 11 wherein at least one of said M and said N is an even integer.

15. The electrical component array of claim 11 wherein at least one of K/N and L/M is an integer.

16. The electrical component array of claim 11 wherein each device of said devices is selected from a capacitor and a varistor.

17. The electrical component array of claim 16 wherein each said device is a capacitor.

18. The electrical component array of claim 17 wherein said capacitor comprises an electrode with lead out tabs.

19. An electrical element comprising an electrical component array of claim 11.

20. A capacitor array comprising:
    a capacitor with terminations of alternating polarity wherein said terminations are arranged in M columns and N rows;
    a circuit comprising pads in a grid of L columns and K rows wherein said pads are of alternating polarity with the proviso that a first pad with $L=\alpha M$ has the same polarity as a second pad with $L=\alpha M+1$ wherein $\alpha$ is an integer.

21. The capacitor array of claim 20 wherein a third pad with K=βN has the same polarity as a fourth pad with K=βN+1 wherein β is an integer.

22. The capacitor array of claim 21 wherein said β is an integer from 1 to 1000.

23. The capacitor array of claim 20 wherein said α is an integer from 1 to 1000.

24. The capacitor array of claim 20 wherein at least one of said M and said N is an even integer.

25. The capacitor array of claim 20 wherein at least one of K/N and L/M is an integer.

26. The capacitor array of claim 20 wherein said capacitor comprises an electrode with lead out tabs.

27. An electrical component comprising a capacitor array of claim 20.

28. A capacitor array comprising:

a multiplicity of capacitors with terminations of alternating polarity wherein said terminations are arranged in M columns and N rows;

a circuit comprising pads in a grid of L columns and K rows wherein said pads are of alternating polarity with the proviso that a first pad with L=αM has the same polarity as a second pad with L=αM+1 wherein α is an integer and a third pad with K=βN has the same polarity as a fourth pad with K=βN+1 wherein β is an integer.

29. The capacitor array of claim 28 wherein said β is an integer from 1 to 1000.

30. The capacitor array of claim 28 wherein said α is an integer from 1 to 1000.

31. The capacitor array of claim 28 wherein at least one of said M and said N is an even integer.

32. The capacitor array of claim 28 wherein at least one of K/N and L/M is an integer.

33. The capacitor array of claim 28 wherein at least one capacitor of said capacitors comprises an electrode with lead out tabs.

34. An electrical element comprising a capacitor array of claim 28.

* * * * *